United States Patent
Kawano (10) Patent No.: US 11,139,254 B2
(45) Date of Patent: Oct. 5, 2021

(54) SEMICONDUCTOR DEVICE AND ELECTRONIC DEVICE

(71) Applicant: FUJITSU LIMITED, Kawasaki (JP)

(72) Inventor: Yoichi Kawano, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/984,207

(22) Filed: Aug. 4, 2020

(65) Prior Publication Data
US 2021/0043586 A1    Feb. 11, 2021

(30) Foreign Application Priority Data
Aug. 8, 2019 (JP) ............................. JP2019-146529

(51) Int. Cl.
*H01L 23/00* (2006.01)
*H01L 23/58* (2006.01)
*H05K 5/06* (2006.01)

(52) U.S. Cl.
CPC .......... *H01L 23/564* (2013.01); *H01L 23/585* (2013.01); *H05K 5/065* (2013.01)

(58) Field of Classification Search
CPC ...... H01L 23/564; H01L 23/585; H05K 5/065
See application file for complete search history.

(56) References Cited

U.S. PATENT DOCUMENTS

| | | | | |
|---|---|---|---|---|
| 7,602,065 B2* | 10/2009 | Hou | ....................... | H01L 23/562 257/758 |
| 7,888,776 B2* | 2/2011 | Ogawa | ................... | H01L 23/585 257/620 |
| 2004/0150070 A1* | 8/2004 | Okada | ................... | H01L 23/585 257/508 |
| 2010/0084751 A1 | 4/2010 | Frederick, Jr. et al. | | |
| 2010/0102421 A1* | 4/2010 | Chang | ................. | H01L 23/5225 257/659 |

FOREIGN PATENT DOCUMENTS

| | | |
|---|---|---|
| JP | 2013-232651 A | 11/2013 |
| WO | 2010/039981 A2 | 4/2010 |

* cited by examiner

*Primary Examiner* — Peniel M Gumedzoe
(74) *Attorney, Agent, or Firm* — Fujitsu Patent Center (57) ABSTRACT

A semiconductor device includes: a semiconductor substrate; a first metal ring which is provided outside a periphery of a circuit region including a signal pad on one surface side of the semiconductor substrate and is interrupted by one or a plurality of openings; a second metal ring provided outside a periphery of the first metal ring; and a resistance layer that connects ends of the first metal ring interrupted by the one or the plurality of openings to each other, wherein the first metal ring includes a first wall portion and a second wall portion that sandwich the circuit region, and a third wall portion and a fourth wall portion that sandwich the circuit region and are connected to the first wall portion and the second wall portion, and the one or the plurality of openings is arranged in the first wall portion close to the signal pad.

9 Claims, 10 Drawing Sheets

SEMICONDUCTOR DEVICE AND ELECTRONIC DEVICE

CROSS-REFERENCE TO RELATED APPLICATION

This application is based upon and claims the benefit of priority of the prior Japanese Patent Application No. 2019-146529, filed on Aug. 8, 2019, the entire contents of which are incorporated herein by reference.

FIELD

The embodiments discussed herein are related to a semiconductor device and an electronic device.

BACKGROUND

It is known that a guard ring made of metal is provided outside the periphery of a circuit region to suppress infiltration of water into the circuit region. For example, it is known to provide a double guard ring surrounding the periphery of an integrated circuit and having gaps at positions that do not overlap each other. It is said that this makes it possible to suppress the infiltration of water into the integrated circuit and reduce a noise signal propagating through the guard ring.

Examples of the related art include Japanese Laid-open Patent Publication No. 2013-232651.

SUMMARY

According to an aspect of the embodiments, a semiconductor device includes: a semiconductor substrate; a first guard ring made of metal, the first guard ring being provided outside a periphery of a circuit region and being interrupted by one or a plurality of openings, the circuit region being a region including a signal pad on one surface side of the semiconductor substrate; a second guard ring made of metal, the second guard ring being provided outside a periphery of the first guard ring on the one surface side of the semiconductor substrate; and a resistance layer that connects ends of the first guard ring interrupted by the one or the plurality of openings to each other, wherein the first guard ring includes a first wall portion and a second wall portion that sandwich the circuit region, and a third wall portion and a fourth wall portion that sandwich the circuit region and are connected to the first wall portion and the second wall portion, and the one or the plurality of openings is arranged in the first wall portion close to the signal pad, of the first guard ring.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT(S)

A signal may leak from a signal pad to a guard ring provided outside the periphery of a circuit region and propagate through the guard ring. In the guard ring described in Patent Literature 1, there is room for improvement in reducing the influence on the circuit region due to the signal leaked from the signal pad into the guard ring.

In one aspect, an object is to reduce the influence on the circuit region due to the signal leaked into the guard ring.

Hereinafter, embodiments will be described with reference to the drawings.

First Embodiment

Figure 1A:
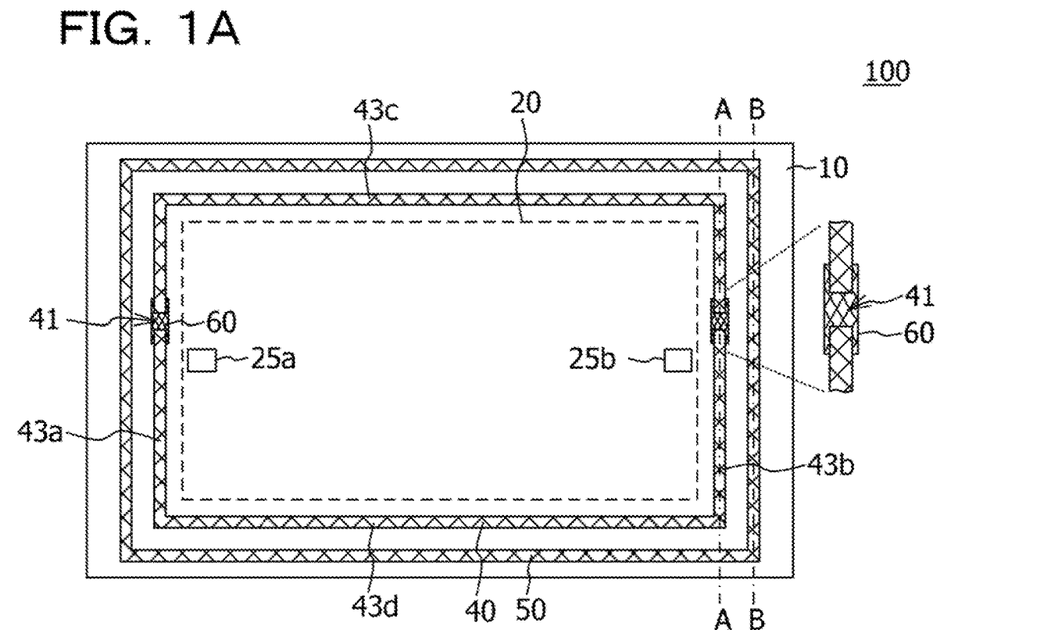
FIG. 1A is a plan view of a semiconductor device according to a first embodiment.
Figure 1B:
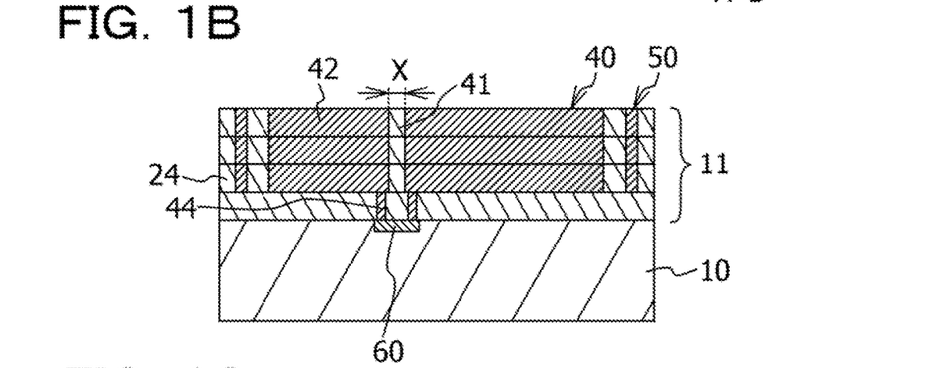
FIG. 1B is a cross-sectional view taken along line A-A of FIG. 1A.
Figure 1C:
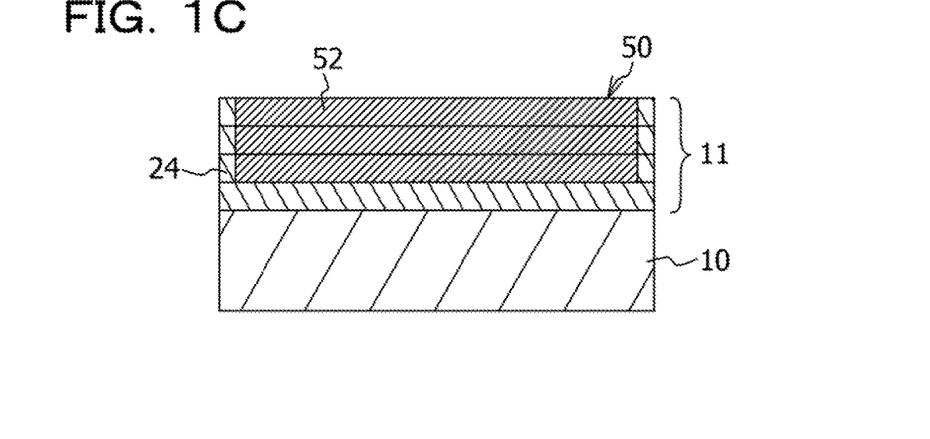
FIG. 1C is a cross-sectional view taken along line B-B of FIG. 1A.

FIG. 1A is a plan view of a semiconductor device 100 according to a first embodiment, FIG. 1B is a cross-sectional view taken along line A-A of FIG. 1A, and FIG. 1C is a cross-sectional view taken along line B-B of FIG. 1A. Note that, in FIG. 1A, cross-hatching is applied to guard rings 40 and 50 and a resistance layer 60 for the sake of clarity of the figure (the same applies to the following similar figures). As illustrated in FIGS. 1A to 1C, the semiconductor device 100 includes a semiconductor substrate 10, the guard ring 40 made of metal, the guard ring 50 made of metal, and the resistance layer 60. The semiconductor substrate 10 is formed with a circuit region 20.

Figure 2:
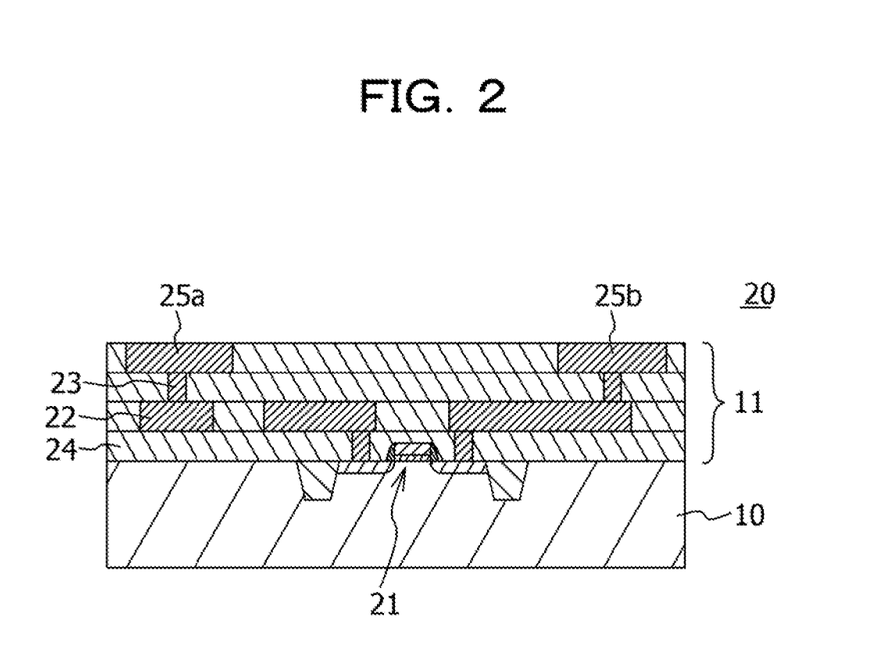
FIG. 2 is a cross-sectional view in a circuit region of the semiconductor device according to the first embodiment.

FIG. 2 is a cross-sectional view in the circuit region 20 of the semiconductor device 100 according to the first embodiment. As illustrated in FIG. 2, circuit elements such as a transistor 21 are formed on the semiconductor substrate 10 in the circuit region 20. The semiconductor substrate 10 may be a compound semiconductor substrate such as a gallium nitride substrate (GaN substrate) or a gallium arsenide substrate (GaAs substrate), or may be a silicon substrate (Si substrate) or the like.

The transistor 21 is electrically connected to a wiring line 22 and a via 23 of a multilayer wiring layer 11 formed on the semiconductor substrate 10. The wiring line 22 and the via 23 are formed of a metal having a low electrical resistivity, for example, gold (Au), copper (Cu), or the like. The multilayer wiring layer 11 includes a plurality of wiring layers, and the wiring lines 22 in different wiring layers are connected to each other by the via 23. The wiring lines 22 are electrically separated from each other by an insulating film 24. The insulating film 24 may be an inorganic insulating film such as a silicon oxide film or a silicon nitride film, or may be an organic insulating film such as a resin film.

The wiring line 22 of the outermost layer of the multilayer wiring layer 11 is formed with an input signal pad 25a for inputting a signal and an output signal pad 25b for outputting a signal. Note that, the outermost layer of the multilayer wiring layer 11 may be formed with wiring line 22 through which a signal propagates, other than the input signal pad 25a and the output signal pad 25b. The wiring line 22 is a wiring line constituting a circuit in the circuit region 20 or a power supply wiring line. As described above, the circuit region 20 is a region in which the circuit elements such as the transistor 21, the wiring line 22, the via 23, the input signal pad 25a, the output signal pad 25b, and the like are formed.

As illustrated in FIGS. 1A to 1C, the guard ring 40 is provided on one surface of the semiconductor substrate 10 and outside the periphery of the circuit region 20. The guard ring 40 is formed in a wall shape in which a metal layer 42 provided in each wiring layer of the multilayer wiring layer 11 is laminated. The metal layer 42 is formed of, for example, gold (Au) or copper (Cu). The metal layer 42 may be formed of the same material as the wiring line 22 and the via 23, or may be formed of a different material. When the metal layer 42 is formed of the same material as the wiring line 22 and the via 23, the metal layer 42 can be formed at the same time as the wiring line 22 and the via 23, so that an increase in manufacturing time is suppressed. The guard ring 40 does not completely surround the periphery of the circuit region 20, but is interrupted by one or a plurality of openings 41. The insulating film 24 is embedded in the openings 41.

The guard ring 40 includes wall portions 43a and 43b facing each other across the circuit region 20, and wall portions 43c and 43d facing each other across the circuit region 20 and connected to the wall portions 43a and 43b. The wall portions 43a to 43d extend linearly in a plan view of the semiconductor substrate 10. The wall portion 43a is close to the input signal pad 25a, and the wall portion 43b is close to the output signal pad 25b.

The opening 41 is provided in the wall portion 43a and the wall portion 43b of the guard ring 40. In the guard ring 40, ends at a portion interrupted by the opening 41 are connected to each other through the resistance layer 60. The metal layer 42 is connected to the resistance layer 60 by a via 44. The resistance layer 60 has an electrical resistivity higher than that of the guard ring 40.

The resistance layer 60 is formed in the semiconductor substrate 10, for example. The resistance layer 60 is a region in which the resistance is increased by, for example, doping the semiconductor substrate 10 with an impurity element. As an example, when the semiconductor substrate 10 is a gallium nitride substrate (GaN substrate), the resistance layer 60 is a region in which the resistance is increased by doping the semiconductor substrate 10 with iron (Fe).

The guard ring 50 is provided outside the periphery of the guard ring 40 on one surface of the semiconductor substrate 10. The guard ring 50 is provided, for example, to completely surround the periphery of the guard ring 40. Similar to the guard ring 40, the guard ring 50 is formed in a wall shape in which a metal layer 52 provided in each wiring layer of the multilayer wiring layer 11 is laminated. The metal layer 52 is formed of, for example, gold (Au) or copper (Cu). The metal layer 52 may be formed of the same material as e wiring line 22 and the via 23, or may be formed of a different material. Furthermore, the metal layer 52 may be formed of the same material as the metal layer 42, or may be formed of a different material.

Figure 3:
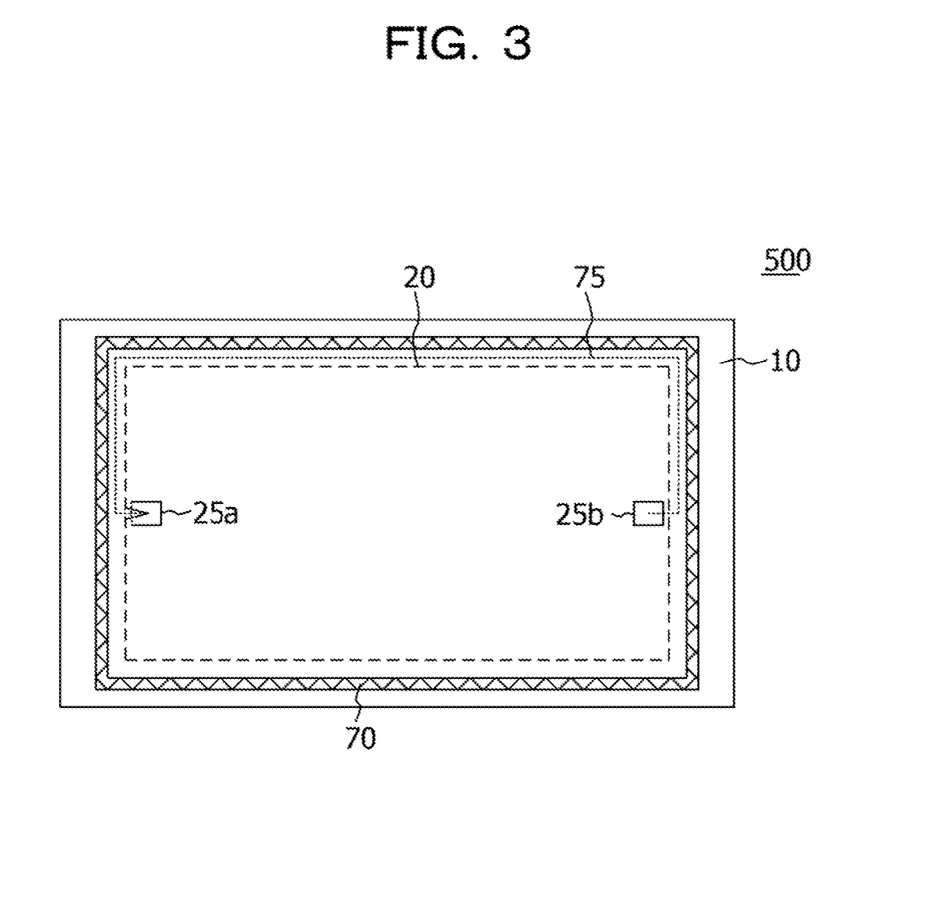
FIG. 3 is a plan view of a semiconductor device according to a first comparative example.

FIG. 3 is a plan view of a semiconductor device 500 according to a first comparative example. As illustrated in FIG. 3, in the semiconductor device 500, a guard ring 70 made of metal is provided outside the periphery of the circuit region 20 on one surface of the semiconductor substrate 10 to completely surround the circuit region 20. Similar to the guard rings 40 and 50 in the first embodiment, the guard ring 70 is formed in a wall shape in which a metal layer provided in each wiring layer of the multilayer wiring layer 11 is laminated. Other structures are the same as those of the first embodiment, so the description is not provided here.

The guard ring 70 is provided, whereby infiltration of water into the circuit region 20 is suppressed. However, the input signal pad 25a and/or the output signal pad 25b may be electromagnetically coupled with the guard ring 70, and a signal may leak from the input signal pad 25a and/or the output signal pad 25b to the guard ring 70. Hereinafter, the signal leaked into the guard ring may be referred to as a leak signal. For example, a signal leaked from the output signal pad 25b into the guard ring 70 may propagate through the guard ring 70 as indicated by a dotted arrow 75 and return to the input signal pad 25a. In this case, the transistor 21 may unnecessarily oscillate due to the leak signal and degrade the characteristics.

Figure 4:
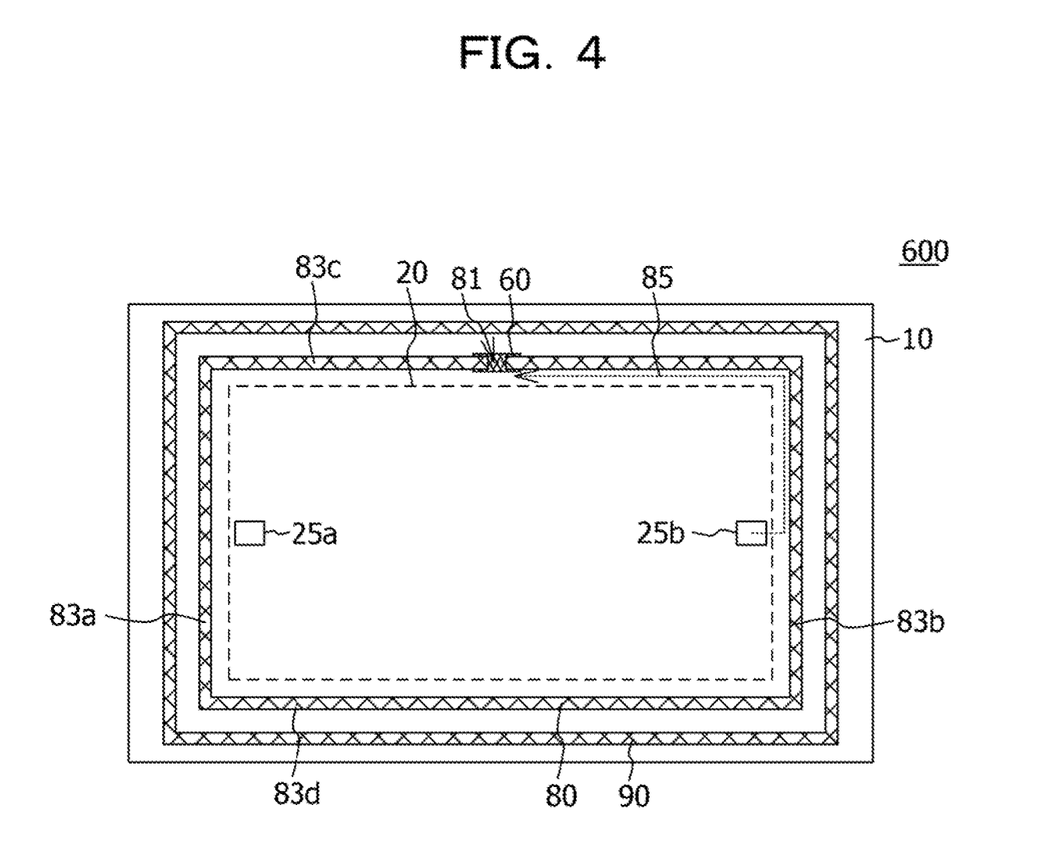
FIG. 4 is a plan view of a semiconductor device according to a second comparative example.

FIG. 4 is a plan view of a semiconductor device 600 according to a second comparative example. As illustrated in FIG. 4, in the semiconductor device 600, a guard ring 80 made of metal is provided outside the periphery of the circuit region 20, and a guard ring 90 made of metal is provided outside the periphery of the guard ring 80. Similar to the guard rings 40 and 50 in the first embodiment, the guard rings 80 and 90 are formed in a wall shape in which a metal layer provided in each wiring layer of the multilayer wiring layer 11 is laminated. The guard ring 80 is interrupted at an opening 81. In the guard ring 80, ends at a portion interrupted by the opening 81 are connected to each other through the resistance layer 60. The guard ring 90 is provided outside the periphery of the guard ring 80 to completely surround the guard ring 80.

Similar to the guard ring 40 in the first embodiment, the guard ring 80 includes wall portions 83a and 83b facing each other across the circuit region 20, and wall portions 83c and 83d facing each other across the circuit region 20 and connected to the wall portion 83a and 83b. The wall portion 83a is close to the input signal pad 25a, and the wall portion 83b is close to the output signal pad 25b. The opening 81 is provided in the wall portion 83c of the guard ring 80. Other structures are the same as those of the first embodiment, so the description is not provided here.

In the second comparative example, the guard ring 80 is interrupted at the opening 81, but since the guard ring 90 is provided outside the periphery of the guard ring 80, infiltration of water into the circuit region 20 is suppressed. Furthermore, the ends of the guard ring 80 interrupted at the opening 81 are connected to each other through the resistance layer 60, whereby the leak signal propagating through the guard ring 80 is attenuated by the resistance layer 60.

However, the opening 81 is provided in the wall portion 83c that is a wall portion other than the wall portion 83a close to the input signal pad 25a of the guard ring 80 and the wall portion 83b close to the output signal pad 25b. For this reason, a signal leaked from the input signal pad 25a and/or the output signal pad 25b into the guard ring 80 is attenuated by the resistance layer 60 after propagating through the guard ring 80. For example, a signal leaked from the output signal pad 25b into the guard ring 80 is attenuated by the resistance layer 60 after propagating through the guard ring 80 as indicated by a dashed arrow 85. The longer the leak signal propagates through the guard ring 80, the more likely the leak signal affects the circuit region 20. For example, before the leak signal reaches the resistance layer 60, the leak signal may be transmitted to the wiring line 22 that is electromagnetically coupled with the guard ring 80, and degradation of the characteristics may occur.

On the other hand, in the first embodiment, as illustrated in FIGS. 1A and 1B, the ends of the guard ring 40 interrupted by the opening 41 are connected to each other through the resistance layer 60. The opening 41 is arranged in the wall portion 43a close to the input signal pad 25a of the guard ring 40 and the wall portion 43b close to the output signal pad 25b of the guard ring 40. As a result, the signal leaked from the input signal pad 25a and/or the output signal pad 25b into the guard ring 40 is immediately attenuated by the resistance layer 60. The influence of the leak signal on the circuit region 20 can therefore be reduced, and the degradation of the characteristics can be suppressed. Furthermore, since the guard ring 50 is provided outside the periphery of the guard ring 40, even if the guard ring 40 is provided with the opening 41, the infiltration of water into the circuit region 20 can be suppressed.

Note that, in the first embodiment, the case has been described where the opening 41 is provided in both the wall portion 43a close to the input signal pad 25a and the wall portion 43b close to the output signal pad 25b, as an example; however, a case may be adopted where the opening 41 is provided on one of the wall portions. For example, a case may be adopted where the opening 41 is provided only on a wall portion close to a pad from which the signal easily leaks to the guard ring 40 out of the input signal pad 25a and the output signal pad 25b.

Second Embodiment

Figure 5:
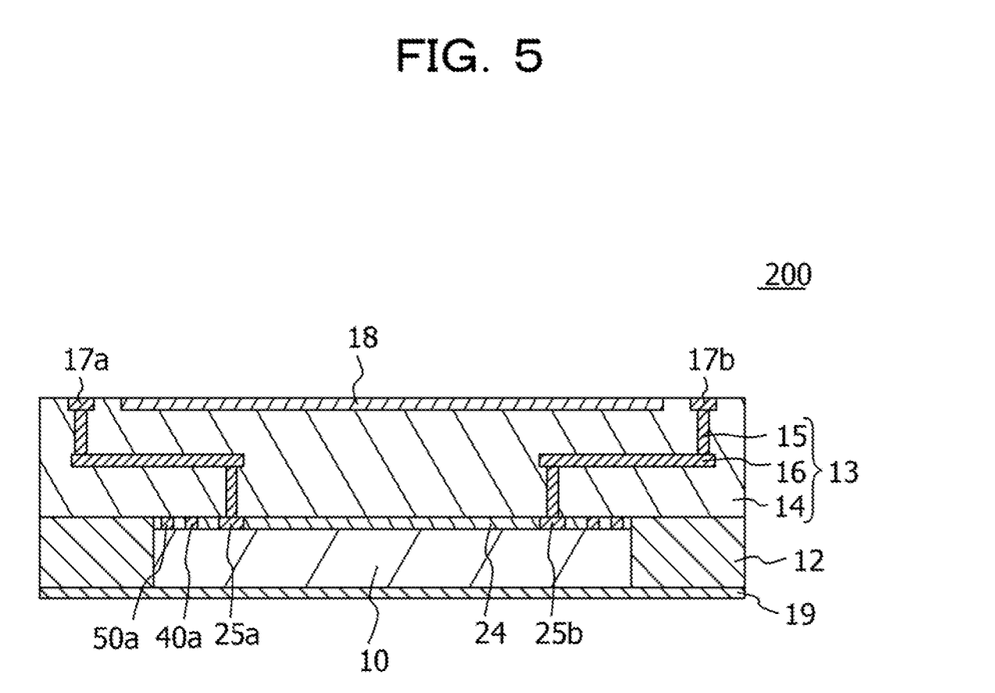
FIG. 5 is a cross-sectional view of a semiconductor device according to a second embodiment.

FIG. 5 is a cross-sectional view of a semiconductor device 200 according to a second embodiment. As illustrated in FIG. 5, the semiconductor device 200 is a Fan Out Wafer Level Package (FOWLP) including the semiconductor substrate 10, a resin layer 12 surrounding side surfaces of the semiconductor substrate 10, and a rewiring layer 13 provided on the semiconductor substrate 10 and the resin layer 12. The resin layer 12 is formed of a thermosetting resin, a thermoplastic resin, an ultraviolet curable resin, or the like. The resin layer 12 may include a filter such as silicon oxide, aluminum oxide, or silicon nitride.

The rewiring layer 13 includes an insulating film 14, a via 15 provided in the insulating film 14, and a rewiring line 16 provided in the insulating film 14. The insulating film 14 is formed of a resin such as epoxy, polyimide, or polybenzoxazole. The via 15 and the rewiring line 16 are formed of a conductive material such as copper (Cu) or aluminum (Al).

The rewiring line 16 of the outermost layer of the rewiring layer 13 is formed with an input signal pad 17a for inputting a signal and an output signal pad 17b for outputting a signal. A high frequency signal input to the input signal pad 17a is input to the input signal pad 25a formed on the semiconductor substrate 10 through the via 15 and the rewiring line 16. The high frequency signal input to the input signal pad 25a is amplified by the transistor 21 in the circuit region 20 (see FIG. 2). The high frequency signal is amplified by the transistor 21 and then output from the output signal pad 25b formed on the semiconductor substrate 10. The high frequency signal output from the output signal pad 25b is externally output from the output signal pad 17b through the via 15 and the rewiring line 16. As described above, the semiconductor device 200 is, for example, an amplifier that amplifies a high frequency signal, and a Monolithic Microwave Integrated Circuit (MMIC) is formed in the circuit region 20. The frequency of the high frequency signal is, for example, 1 GHz to 100 GHz, and, as an example, is a microwave or millimeter wave of 10 GHz to 50 GHz.

A ground plate 18 that is a metal layer grounded to the ground is provided on a surface of the rewiring layer 13. The ground plate 18 is located above the semiconductor substrate 10 and has an outer shape larger than that of the semiconductor substrate 10 in a plan view. Thus, the ground plate 18 overlaps the semiconductor substrate 10 and completely covers the semiconductor substrate 10. The ground plate 18 is provided, whereby the circuit of the circuit region 20 formed on the semiconductor substrate 10 can be restrained from capacitively coupling with other members other than the semiconductor device 200, and a change can be suppressed in the frequency characteristic of gain in the circuit of the circuit region 20.

A heat spreader 19 that is a metal layer is provided on a surface on an opposite side of the semiconductor substrate 10 and the resin layer 12 from a surface on which the rewiring layer 13 is provided. As a result, even when the transistor 21 is a high power transistor, for example, a high electron mobility transistor or the like, and generates a large amount of heat, heat dissipation to a heat dissipation plate or the like is promoted through the heat spreader 19, so that characteristic degradation due to heat generation can be suppressed. The heat spreader 19 is, for example, a copper (Cu) layer.

Figure 6:
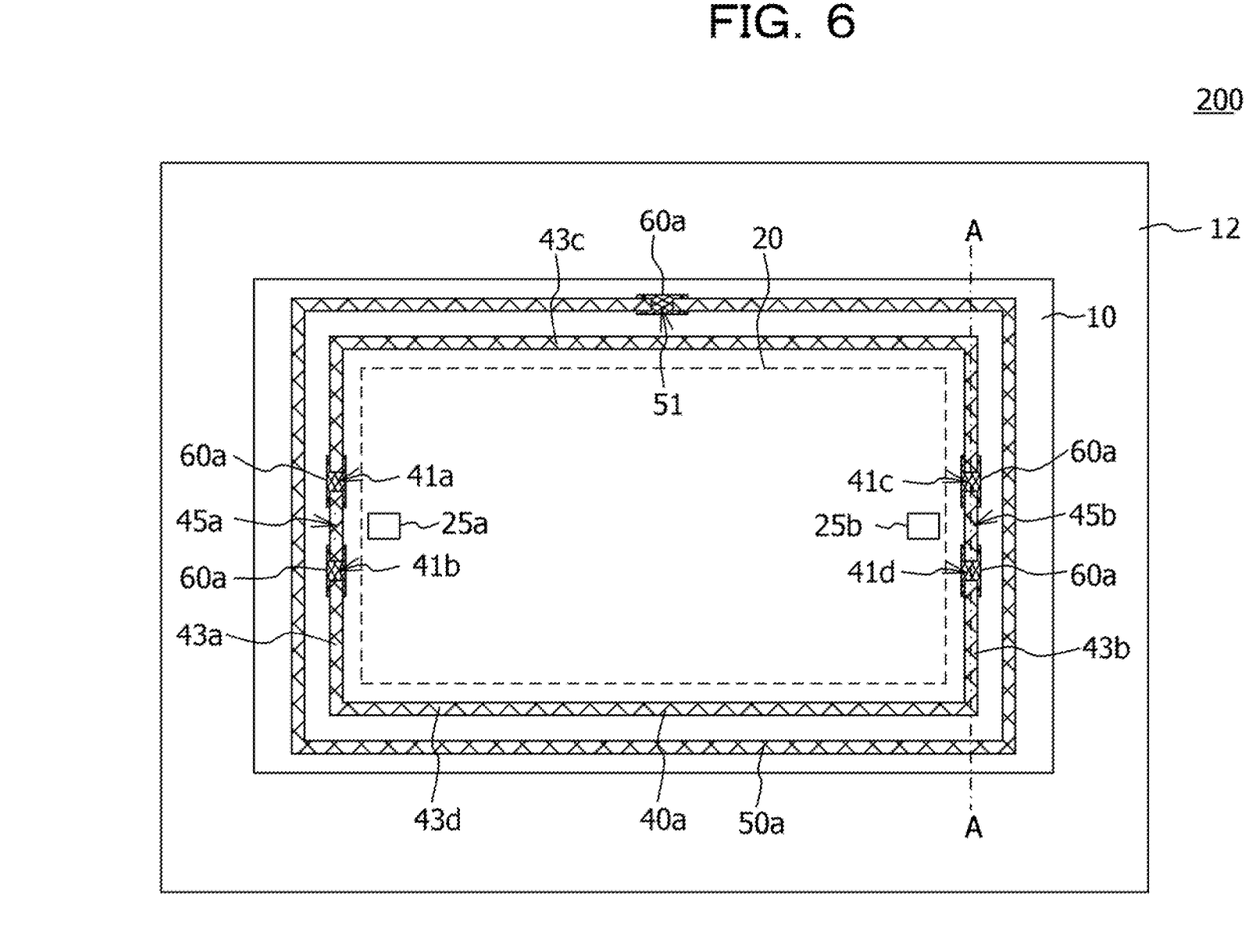
FIG. 6 is a plan view of the semiconductor device according to the second embodiment.
Figure 7:
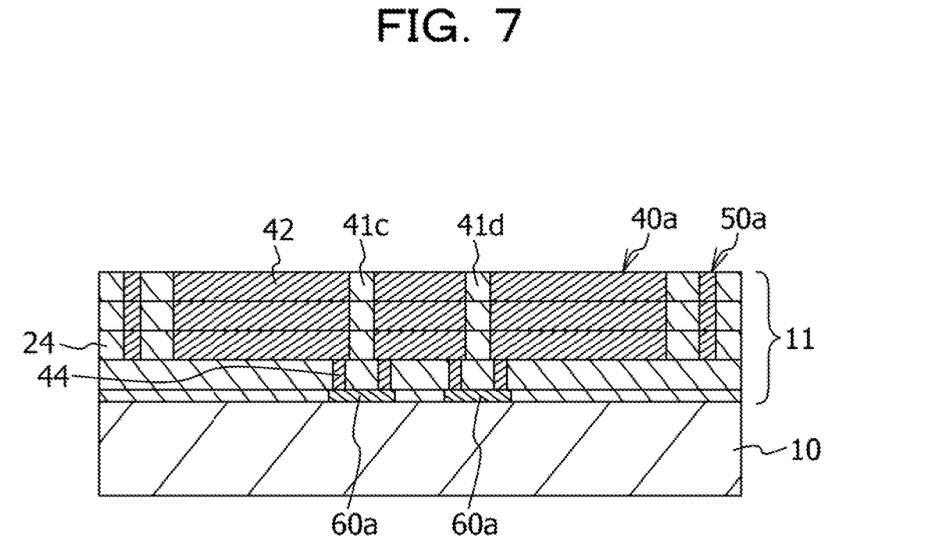
FIG. 7 is a cross-sectional view taken along Pine A-A of FIG. 6.

FIG. 6 is a plan view of the semiconductor device 200 according to the second embodiment. FIG. 7 is a cross-sectional view taken along line A-A of FIG. 6. FIG. 6 illustrates the semiconductor substrate 10 and the resin layer 12, seeing through the rewiring layer 13, the ground plate 18, and the like. As illustrated in FIGS. 6 and 7, a guard ring 40a is interrupted by two openings 41a and 41b provided in the wall portion 43a and two openings 41c and 41d provided in the wall portion 43b. The openings 41a and 41b are arranged on sides of a facing region 45a that faces the input signal pad 25a, in the wall portion 43a, to sandwich the facing region 45a. Similarly, the openings 41c and 41d are arranged on sides of the facing region 45b that faces the output signal pad 25b, in the wall portion 43b, to sandwich the facing region 45b.

In the guard ring 40a, ends at a portion interrupted by each of the openings 41a to 41d are connected to each other through a resistance layer 60a. The metal layer 42 is connected to the resistance layer 60a by the via 44. The resistance layer 60a is a metal film provided on the semiconductor substrate 10 and formed of a metal that has an electrical resistivity higher than that of the guard ring 40a. The resistance layer 60a is, for example, an alloy film containing nickel and chromium.

A guard ring 50a is interrupted by an opening 51 arranged at a position displaced from the openings 41a to 41d not to overlap the openings 41a to 41d of the guard ring 40a. In the guard ring 50a, ends at a portion interrupted by the opening 51 are connected to each other through the resistance layer 60a similarly to the guard ring 40a. Other structures of the semiconductor device 200 of the second embodiment are the same as those of the semiconductor device 100 of the first embodiment, so the description is not provided here.

In the second embodiment, as illustrated in FIG. 6, the guard ring 50a is interrupted at the opening 51, but the opening 51 is located displaced from the openings 41a to 41d provided in the guard ring 40a, so that infiltration of water into the circuit region 20 can be suppressed. Furthermore, when the guard ring 50a is formed by the lift-off method, the presence of the opening 51 facilitates lift-off and improves the ease of manufacturing the guard ring 50a.

As illustrated in FIG. 6, the openings 41c and 41d are arranged on both sides of the facing region 45b that faces the output signal pad 25b, of the wall portion 43b of the guard ring 40a. As a result, the high frequency signal leaked from the output signal pad 25b into the guard ring 40a is attenuated by the resistance layer 60a on both sides of the facing region 45b. For this reason, the high frequency signal leaked into the guard ring 40a can be effectively attenuated. The influence of the leak signal on the circuit region 20 can therefore be effectively reduced. Furthermore, the guard ring 40a exists in the facing region 45b, whereby the infiltration of water into the output signal pad 25b can be suppressed.

As illustrated in FIG. 6, the openings 41a and 41b are arranged on both sides of the facing region 45a that faces the input signal pad 25a, of the wall portion 43a of the guard ring 40a. As a result, the high frequency signal leaked from the input signal pad 25a into the guard ring 40a is attenuated by the resistance layers 60a on both sides of the facing region 45a, so that the high frequency signal leaked into the guard ring 40a can be effectively attenuated. The influence of the leak signal on the circuit region 20 can therefore be effectively reduced.

As illustrated in FIG. 7, the resistance layer 60a is an alloy film provided on the semiconductor substrate 10 and containing nickel (Ni) and chromium (Cr). As in the first embodiment, the region in which the resistance is increased by doping the semiconductor substrate 10 with the impurity element may be the resistance layer 60, but as in the second embodiment, the resistance layer 60a is preferably an alloy film containing Ni and Cr. As a result, the impedance of the resistance layer 60a can be increased, and the high frequency signal leaked into the guard ring 40a can be effectively attenuated. For example, the resistance layer 60a may be an alloy film of Ni and Cr, may be an alloy film of Ni, Cr, and iron (Fe), or may be an alloy film of Ni, Cr, Fe, and manganese (Mn). Furthermore, the resistance layer 60a is not limited to the alloy film containing Ni and Cr, but may be a metal film formed of a metal that has an electrical resistivity higher than that of the guard ring 40a.

As illustrated in FIG. 6, the ends of the guard ring 50a in the opening 51 are connected to each other through the resistance layer 60a. As a result, even when the high frequency signal is leaked into the guard ring 50a, the high frequency signal can be attenuated by the resistance layer 60a.

As illustrated in FIG. 5, the semiconductor device 200 is a FOWLP, the side surfaces of the semiconductor substrate 10 are surrounded by the resin layer 12, and the rewiring layer 13 is laminated on the semiconductor substrate 10 and the resin layer 12. In this case, water may infiltrate through a gap between the resin layer 12 and the rewiring layer 13 and reach the semiconductor substrate 10. Thus, in such a case, it is preferable to provide the guard ring 40a and the guard ring 50a on a surface on the rewiring layer 13 side of the semiconductor substrate 10.

Note that, in the second embodiment, the case has been described where the openings 41a and 41b are provided on both sides of the facing region 45a, and the openings 41c and 41d are provided on both sides of the facing region 45b, as an example. However, not limited to this case, a case may be adopted where the opening is provided on at least one of both sides of the facing region 45a or both sides of the facing region 45b. For example, a case may be adopted where the openings 41a and 41b are provided and the openings 41c and 41d are not provided, or the openings 41a and 41b are not provided and the openings 41c and 41d are provided. Note that, to attenuate the high frequency signal leaked into the guard ring 40a, a case is preferably adopted where all the openings 41a to 41d are provided.

Third Embodiment

Figure 8:
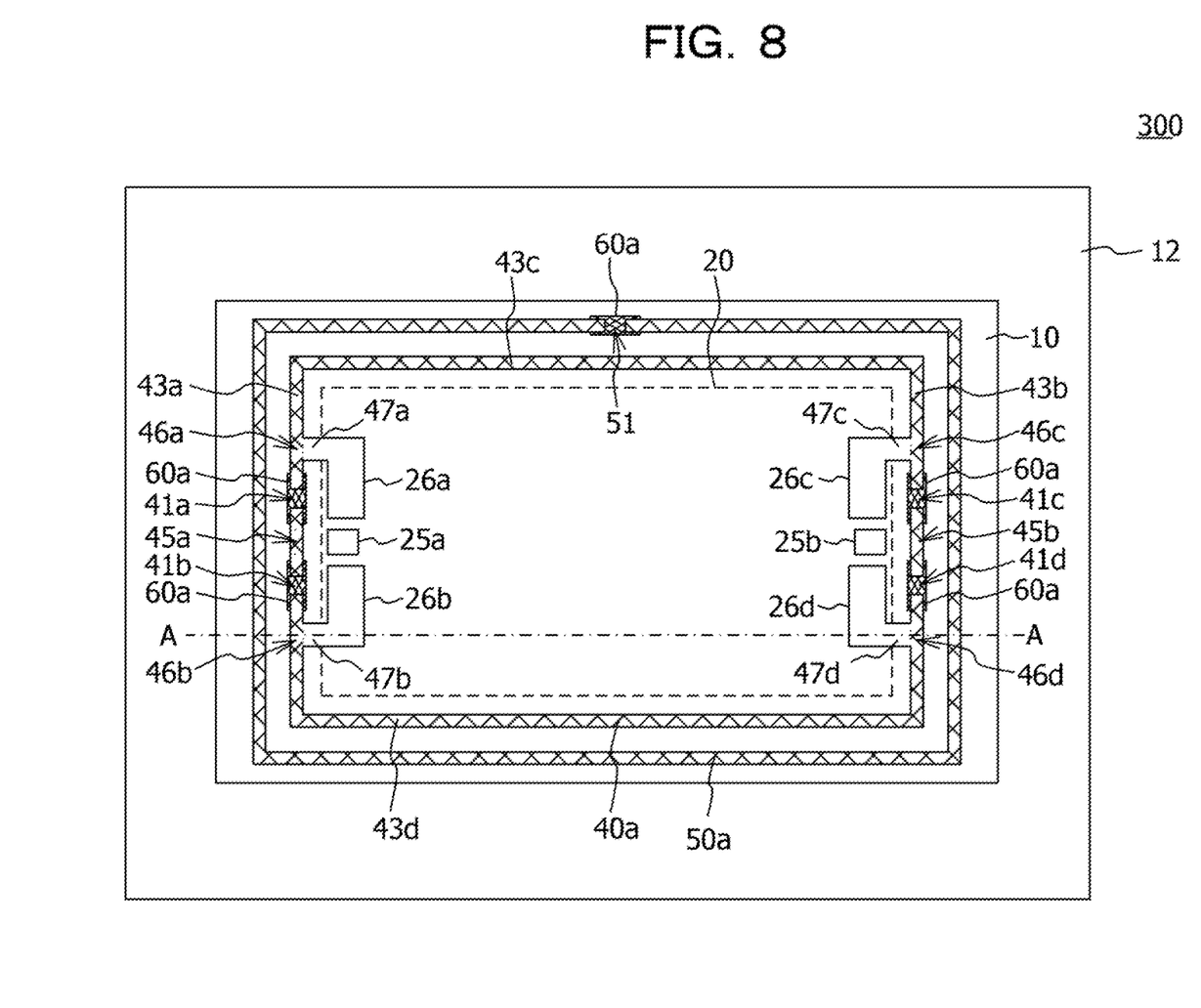
FIG. 8 is a plan view of a semiconductor device according to a third embodiment.
Figure 9:
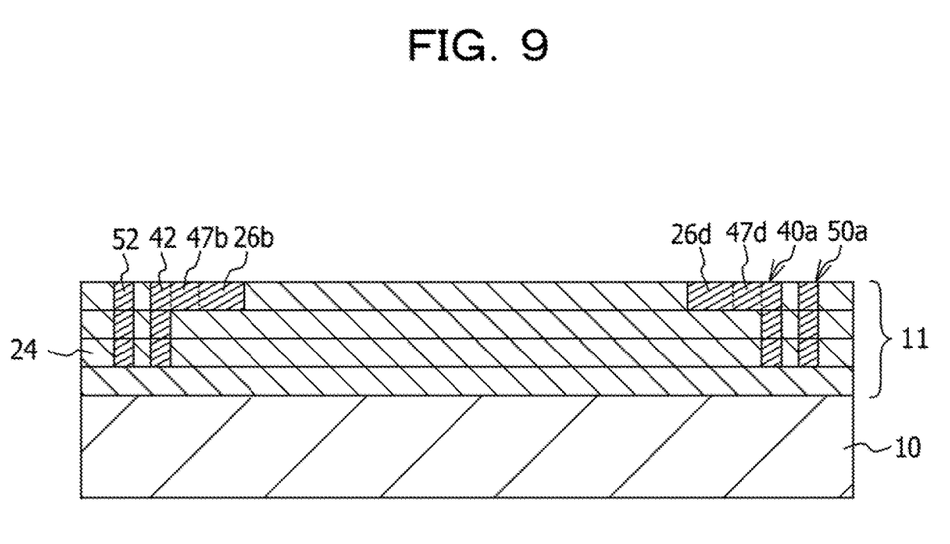
FIG. 9 is a cross-sectional view taken along line A-A in FIG. 8.

FIG. 8 is a plan view of a semiconductor device 300 according to a third embodiment. Similar to FIG. 6 of the second embodiment, FIG. 8 illustrates the semiconductor substrate 10 and the resin layer 12, seeing through the rewiring layer 13, the ground plate 18, and the like. FIG. 9 is a cross-sectional view taken along line A-A of FIG. 8. Note that, in FIG. 9, the transistor 21, the wiring line 22, and the like formed in the circuit region 20 are not illustrated for the sake of clarity of the figure. As illustrated in FIGS. 8 and 9, in the semiconductor device 300, ground pads 26a and 26b are provided on both sides of the input signal pad 25a, and ground pads 26c and 26d are provided on both sides of the output signal pad 25b. In the guard ring 40a, a region 46a located on an opposite side of the opening 41a from the facing region 45a is connected to the ground pad 26a through a metal layer 47a. In the guard ring 40a, a region 46b located on an opposite side of the opening 41b from the facing region 45a is connected to the ground pad 26b through a metal layer 47b. In the guard ring 40a, a region 46c located on an opposite side of the opening 41c from the facing region 45b is connected to the ground pad 26c through a metal layer 47c. In the guard ring 40a, a region 46d located on an opposite side of the opening 41d from the facing region 45b is connected to the ground pad 26d through a metal layer 47d. Other structures are the same as those of the second embodiment, so the description is not provided here.

In the third embodiment, in the guard ring 40a, the region 46c located on the opposite side of the opening 41c from the facing region 45b is connected to the ground pad 26c, and the region 46d located on the opposite side of the opening 41d from the facing region 45b is connected to the ground pad 26d. The high frequency signal leaked from the output signal pad 25b into the guard ring 40a is attenuated by the resistance layer 60a, but may propagate through the guard ring 40a beyond the resistance layer 60a. However, the regions 46c and 46d are connected to the ground pads 26c and 26d, whereby the high frequency signal passing through the resistance layer 60a can be released to the ground. The influence of the leak signal on the circuit region 20 can therefore be effectively reduced.

Furthermore, in the guard ring 40a, the region 46a located on the opposite side of the opening 41a from the facing region 45a is connected to the ground pad 26a, and the region 46b located on the opposite side of the opening 41b from the facing region 45a is connected to the ground pad 26b. The high frequency signal leaked from the input signal pad 25a into the guard ring 40a is attenuated by the resistance layer 60a, but may propagate through the guard ring 40a beyond the resistance layer 60a. However, the regions 46a and 46b are connected to the ground pads 26a and 26b, whereby the high frequency signal passing through the resistance layer 60a can be released to the ground. The influence of the leak signal on the circuit region 20 can therefore be effectively reduced.

Note that, in the third embodiment, the case has been described where all of the regions 46a to 46d are connected to the ground pads 26a to 26d, as an example; however, a case may be adopted where at least one of the regions 46a to 46d is connected to the ground pad.

In the second and third embodiments, the case has been described where only one opening 51 is provided in the guard ring 50a, as an example; however, a case may be adopted where two or more openings 51 are provided. When the multiple openings 51 are provided, the openings 51 are preferably provided on a wall portion of the guard ring 50a located outside the wall portion 43c of the guard ring 40a and a wall portion of the guard ring 50a located outside the wall portion 43d of the guard ring 40a.

In the first to third embodiments, the case has been described where the double guard ring is provided around the circuit region 20, as an example; however, a case may be adopted where a guard ring of triple or more, such as a triple or quadruple guard ring, is provided. When the guard ring of triple or more is provided, it is sufficient that the innermost guard ring is the guard ring 40 or 40a.

Fourth Embodiment

Figure 10:
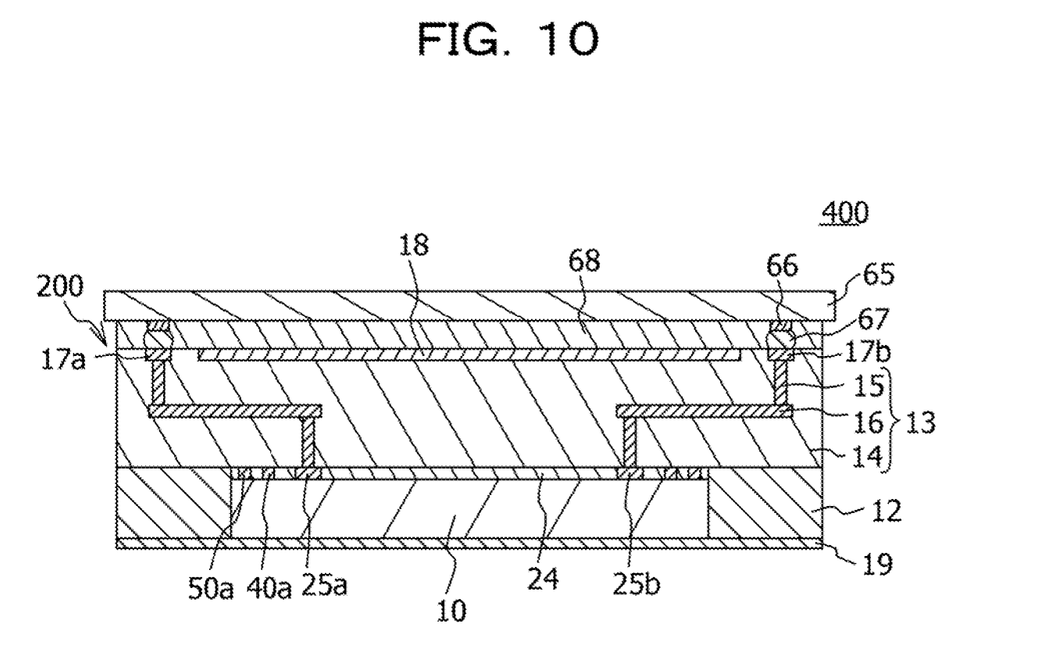
FIG. 10 is a cross-sectional view of an electronic device according to a fourth embodiment.

FIG. 10 is a cross-sectional view of an electronic device 400 according to a fourth embodiment. As illustrated in FIG. 10, the electronic device 400 includes a mounting substrate 65 and the semiconductor device 200 flip-chip-mounted on the mounting substrate 65. The input signal pads 17a and the output signal pads 17b are bonded to pads 66 of the mounting substrate 65 with solder 67, whereby the semiconductor device 200 is flip-chip-mounted on the mounting substrate 65. An underfill material 68 may be filled between the mounting substrate 65 and the semiconductor device 200. The underfill material 68 may be formed of, for example, an epoxy resin and contain a filler such as silicon oxide.

When the semiconductor device 200 is an amplifier, a case may be adopted where the mounting substrate 65 is an antenna substrate including one or a plurality of radiating elements on a surface on an opposite side of its surface on which the semiconductor device 200 is mounted. For example, the electronic device 400 may be an amplification device used in the fifth generation mobile communication system. The mounting substrate 65 may be, for example, a substrate in which a glass epoxy resin of the Flame retardant type 4 (FR-4) standard and a metal foil are laminated, or a substrate in which a ceramic and a metal foil are laminated.

In the fourth embodiment, the case has been described where the semiconductor device 200 of the second embodiment is mounted on the mounting substrate 65, as an example; however, a case may be adopted where the semiconductor device 100 of the first embodiment or the semiconductor device 300 of the third embodiment is mounted on the mounting substrate 65.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
a semiconductor substrate;
a first guard ring made of metal, the first guard ring being provided outside a periphery of a circuit region and being interrupted by one or a plurality of openings, the circuit region being a region including a signal pad on one surface side of the semiconductor substrate;
a second guard ring made of metal, the second guard ring being provided outside a periphery of the first guard ring on the one surface side of e semiconductor substrate; and
a resistance layer that connects ends of the first guard ring interrupted by the one or the plurality of openings to each other, wherein
the first guard ring includes a first wall portion and a second wall portion that sandwich the circuit region, and a third wall portion and a fourth wall portion that sandwich the circuit region and are connected to the first wall portion and the second wall portion, and
the one or the plurality of openings is arranged in the first all portion close to the signal pad, of the first guard ring.

2. The semiconductor device according to claim 1, wherein the one or the plurality of openings is arranged on both sides of a facing region that faces the signal pad, in the first wall portion.

3. The semiconductor device according to claim 2, wherein the first guard ring is connected to a ground pad arranged on a side of the signal pad in at least one of two regions located on opposite sides of the one or the plurality of openings in the first wall portion from the facing region.

4. The semiconductor device according to claim 1, wherein
the signal pad includes an input signal pad and an output signal pad,
the first wall portion of the first guard ring is close to the input signal pad, and the second wall portion of the first guard ring is close to the output signal pad, and
the one or the plurality of openings is arranged on both sides of a first facing region that faces the input signal pad, in the first wall portion, and on both sides of a second facing region that faces the output signal pad, in the second wall portion.

5. The semiconductor device according to claim 4, wherein the first guard ring is connected to ground pads arranged on both sides of the input signal pad in both of two regions located on opposite sides of the one or the plurality of openings in the first wall portion from the first facing region, and is connected to ground pads arranged on both sides of the output signal pad in both of two regions located on opposite sides of the one or the plurality of openings in the second wall portion from the second facing region.

6. The semiconductor device according to claim 1, wherein the resistance layer is a metal film formed of a metal that has an electrical resistivity higher than an electrical resistivity of the first guard ring.

7. The semiconductor device according to claim 1, wherein the resistance layer is an alloy film that contains nickel and chromium.

8. The semiconductor device according to claim 1, further comprising:
a resin layer that surrounds the semiconductor substrate; and
a rewiring layer laminated on the semiconductor substrate and the resin layer.

9. An electronic device, comprising:
a semiconductor device; and a mounting substrate on which the semiconductor device is mounted, wherein the semiconductor device includes a semiconductor substrate, a first guard ring made of metal, the first guard ring being provided outside a periphery of a circuit region and being interrupted by one or a plurality of openings, the circuit region being a region including a signal pad on one surface side of the semiconductor substrate, a second guard ring made of metal, the second guard ring being provided outside a periphery of the first guard ring on the one surface side of the semiconductor substrate, and a resistance layer that connects ends of the first guard ring interrupted by the one or the plurality of openings to each other, wherein the first guard ring includes a first wall portion and a second wall portion that sandwich the circuit region, and a third wall portion and a fourth wall portion that sandwich the circuit region and are connected to the first wall portion and the second wall portion, and the one or the plurality of openings is arranged in the first wall portion close to the signal pad, of the first guard ring.

* * * * *